United States Patent
Law et al.

(10) Patent No.: US 8,264,067 B2
(45) Date of Patent: Sep. 11, 2012

(54) THROUGH SILICON VIA (TSV) WIRE BOND ARCHITECTURE

(75) Inventors: Oscar M. K. Law, Hsin-Chu (TW); Kuo H. Wu, Hsin-Chu (TW); Wei-Chih Yeh, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 154 days.

(21) Appl. No.: 12/838,213

(22) Filed: Jul. 16, 2010

(65) Prior Publication Data

US 2011/0084365 A1    Apr. 14, 2011

Related U.S. Application Data

(60) Provisional application No. 61/250,295, filed on Oct. 9, 2009.

(51) Int. Cl.
  *H01L 23/535*   (2006.01)
(52) U.S. Cl. ............ 257/621; 257/698; 257/E23.011; 257/E21.597; 257/E23.067; 257/E23.174
(58) Field of Classification Search .......... 438/667, 438/698; 257/621, E23.011, E21.597, E23.067, 257/698, E23.174
  See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,037,822 A * | 3/2000 | Rao et al. | 327/298 |
| 6,184,060 B1 | 2/2001 | Siniaguine | |
| 6,316,981 B1 * | 11/2001 | Rao et al. | 327/298 |
| 6,322,903 B1 | 11/2001 | Siniaguine et al. | |
| 6,448,168 B1 * | 9/2002 | Rao et al. | 438/598 |
| 6,465,892 B1 | 10/2002 | Suga | |
| 6,472,293 B1 | 10/2002 | Suga | |
| 6,495,454 B2 * | 12/2002 | Livengood et al. | 438/667 |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |

(Continued)

*Primary Examiner* — George Fourson, III
(74) *Attorney, Agent, or Firm* — Slater & Matsil, L.L.P.

(57) ABSTRACT

A through silicon via architecture for integrated circuits is provided. The integrated circuit (IC) includes a substrate with a top surface and a bottom surface with circuitry formed on the top surface, a plurality of bonding pads formed along a periphery of the bottom surface, and a backside metal layer (BML) formed on the bottom surface and electrically coupled to a second subset of bonding pads in the plurality of bonding pads. A first subset of bonding pads in the plurality of bonding pads is electrically coupled to circuitry on the top surface with through silicon vias (TSV). The BML distributes electrical signals provided by the second subset of bonding pads.

19 Claims, 8 Drawing Sheets

U.S. PATENT DOCUMENTS

| | | |
|---|---|---|
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 2002/0020862 A1* | 2/2002 | Livengood et al. ............ 257/276 |
| 2002/0074637 A1* | 6/2002 | McFarland .................... 257/686 |
| 2006/0214294 A1* | 9/2006 | Fukasawa ..................... 257/738 |
| 2010/0096760 A1* | 4/2010 | Yu et al. ........................ 257/774 |
| 2010/0276814 A1* | 11/2010 | Lee et al. ...................... 257/774 |
| 2011/0193216 A1* | 8/2011 | Lin et al. ....................... 257/698 |

\* cited by examiner

THROUGH SILICON VIA (TSV) WIRE BOND ARCHITECTURE

This application claims the benefit of U.S. Provisional Patent Application Ser. No. 61/250,295, filed on Oct. 9, 2009, and entitled "Through Silicon Via (TSV) Wire Bond Architecture," which application is incorporated herein by reference.

TECHNICAL FIELD

The disclosure relates generally to integrated circuits, and more particularly to a through silicon via (TSV) wire bond architecture.

BACKGROUND

Generally, wire bonding is a method for forming connections between an integrated circuit (IC) and a package containing the IC or directly to a printed circuit board. In wire bonding, a wire is used to create an electrical connection from bonding pads on the IC and the package. The wire may be made from gold, aluminum, copper, alloys thereof, and so forth. Wire bonding is generally considered to be cost effective and flexible and is used to assemble a large percentage of semiconductor packages.

An alternate technique used for connecting ICs to external circuitry or other ICs is commonly referred to as flip chip. In flip chip, ICs are connected to other circuits, such as external circuitry or other ICs with solder bumps deposited onto chip pads. The solder bumps may be deposited on the chip chaps on a top side of a semiconductor wafer during wafer processing. The IC may then be flipped over (hence the name) so that its top surface faces down and then soldered to complete the interconnection between the IC and external circuitry or other ICs.

Flip chip replaces the bond wires used in wire bonding with solder bumps for external signal and power connections. The use of solder bumps helps to reduce a significant current-resistance (IR) drop seen in wire bonding with high power applications since long and highly resistive bond wires are eliminated. Signals and power may be distributed within a flip chip IC using stacked via structures.

SUMMARY

In accordance with an embodiment, an integrated circuit (IC) is provided. The IC includes a substrate with a top surface and a bottom surface with circuitry formed on the top surface, a plurality of bonding pads formed along a periphery of the bottom surface, and a backside metal layer (BML) formed on the bottom surface and electrically coupled to a second subset of bonding pads in the plurality of bonding pads. A first subset of bonding pads in the plurality of bonding pads is electrically coupled to circuitry on the top surface with through silicon vias (TSV). The BML distributes electrical signals provided by the second subset of bonding pads.

In accordance with another embodiment, an integrated circuit (IC) is provided. The IC includes a substrate with a top surface and a bottom surface with circuitry disposed on the top surface, a first bonding pad disposed on the bottom surface, and a backside metal layer (BML) disposed on the bottom surface and electrically coupled to a second bonding pad formed on the bottom surface. The first bonding pad is electrically coupled to circuitry on the top surface with a through silicon via (TSV). The BML distributes a first signal provided by the second bonding pad.

In accordance with another embodiment, a three-dimensional (3D) stacked multi-chip module is provided. The 3D stacked multi-chip module includes a first integrated circuit (IC) having a substrate with a first top surface and a first bottom surface with circuitry is formed on the first top surface, and a second IC. The second IC includes a substrate with a second top surface and a second bottom surface with circuitry is formed on the second top surface, a first plurality of bonding pads formed along a periphery of the second bottom surface, and a backside metal layer (BML) formed on the second bottom surface and electrically coupled to a second subset of bonding pads in the plurality of bonding pads. A first subset of bonding pads in the first plurality of bonding pads is electrically coupled to circuitry on the second top surface with through silicon vias (TSV). The BML distributes electrical signals provided by the second subset of bonding pads. The first IC is bonded to the second IC.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely a system in a package (SiP) comprising multiple chips. The embodiments may also be applied, however, to three-dimensional stacked multi-chip modules, system on a chip (SoC), integrated circuits comprising single chips, and so on.

As discussed above, wire bonding provides a cost effective and flexible solution for assembling semiconductor packages. However, in high power applications, the long and thin (therefore, highly resistive) bond wires may result in a large IR drop. Large IR drops may force the use of voltage supplies with higher voltage potentials, which may be more difficult to implement or more expensive. Large IR drops may also force operation with reduced noise margins, which may make devices more susceptible to voltage supply noise.

The use of flip chip techniques may help to reduce the IR drop in high power applications. However, flip chip requires power and signal distribution using stacked via structures between the multiple chips, which may incur higher production costs. Additionally, in a SiP with multiple flip chips arranged in a vertical stack, power and signal distribution must flow through the entirety of the vertical stack. This requires that the lower flip chips in the vertical stack have built-in compensation for all of the power and signals flowing through them. This may require that the lower flip chips be larger than necessary to compensate for the additional power and signals routed through them.

Figure 1:
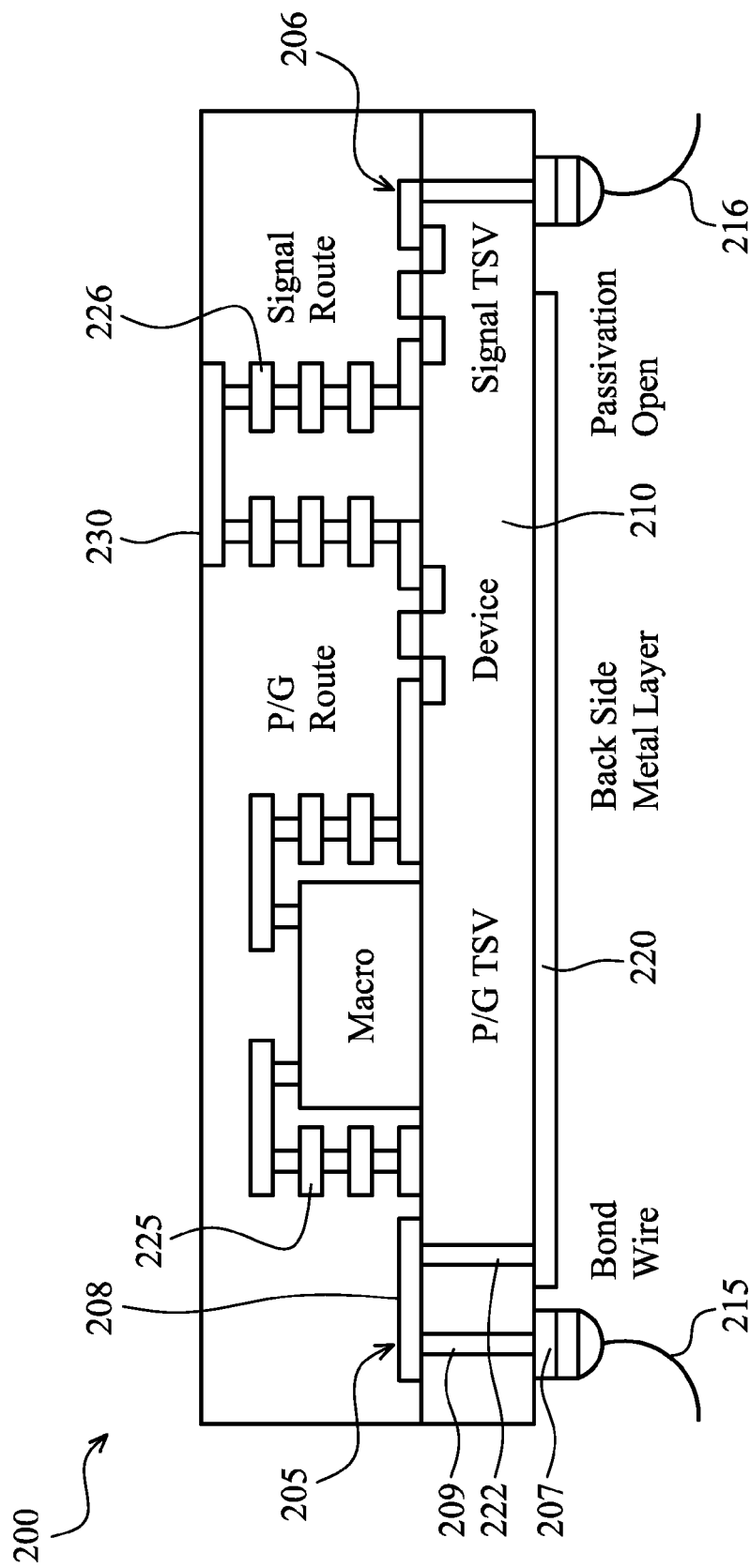
FIG. 1 is a diagram of a cross-sectional view of an IC.

FIG. 1 illustrates a cross-sectional view of an IC 200. IC 200 is fabricated using a through silicon via (TSV) wire bond architecture, wherein power and signals may be distributed through TSVs, such as power via 205 and signal via 206, formed through a substrate 210. Once through the TSVs, power and signals may be routed to internal circuitry through internal metal layers as in a typical architecture.

A TSV, such as power via 205, includes a first conductive pad 207 formed on a first surface of substrate 210 and a conductive member 209 filling a via formed in substrate 210, may be connected to internal metal routing 208 formed on a second surface of substrate 210. Conductive member 209 electrically connects first conductive pad 207 and internal metal routing 208. Internal metal routing 208 may then be used to distribute electrical signals and/or power.

However, in addition to internal metal layer routing, power and signals may also be distributed by a backside metal layer (BML) 220. BML 220 may be formed on a side of substrate 210 opposite integrated circuits. BML 220 may be used for power and signals distribution. IC 200 may be connected externally using bond wires, such as power bond wire 215 and signal bond wire 216.

Preferably, BML 220 may be created from aluminum, copper, gold, alloys thereof, and so forth, to provide a low resistive metal for distribution of power and signals. BML 220 may also be formed with a thickness greater than a normal metal layer to further reduce resistivity of BML 220. The reduced resistivity of BML 220 may lead to a lower IR drop. This may be possible since BML 220 may not have front side metal layer mechanical stress and via size limitations. Preferably, BML 220 may be formed to a total thickness of at least two times (2×) the thickness of a normal metal layer to reduce resistivity. Furthermore, BML 220 may be arranged vertically, horizontally, diagonally, zig zag fashion, or randomly for power distribution, with diagonal arrangement being preferred. BML 220 may also be referred to as a redistribution layer (RDL).

Preferably, to electrically connect BML 220 to power or signals, a TSV (for example, a power via 222) may be used to connect power or a signal to BML 220. The use of TSVs may be preferred over directly bonding to bond pads in BML 220 since a TSV is generally smaller in size than a bond pad, thereby the dimensions of BML 220 may be kept to a minimum. The smaller size of a TSV becomes especially advantageous when a large number of TSVs are used to provide power to BML 220 in order to minimize IR drop. The use of TSVs may not prohibit the attachment of other ICs to IC 200, which is the case if wire bonding was used to electrically connect power and signals to BML 220.

In addition to connecting to power and signals through a TSV, BML 220 may electrically connect to power and signals through connections formed on the same side as BML 220. Connections formed on the same side as BML 220 may be a direct connection to a bond pad.

Additional power and signals distribution may be performed using power and signal routes created in internal metal layers, such as P/G route 225 and signal route 226. Furthermore, BML 220 may be used to provide an additional measure of power and signals distribution flexibility when distribution in internal metal layers may prove to be difficult or result in too large of an IR drop. TSVs may be used to provide connectivity between internal metal layers and BML 220.

Figure 2A:
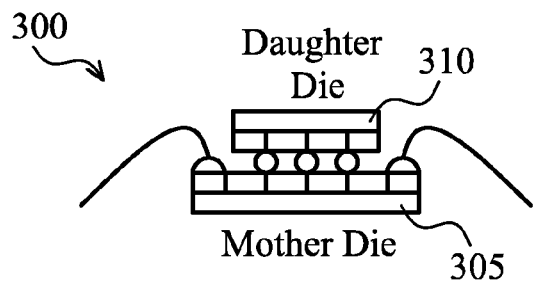
FIG. 2a is a diagram of a first SoC.

IC 200 includes pads, such as pad 230, to allow placement of solder bumps on IC 200, which may allow IC 200 to connect to external circuits or other ICs using the flip chip technique. IC 200 may then be part of a system on a chip (SoC) comprised of multiple ICs. FIG. 2a illustrates a SoC 300. SoC 300 comprises a mother die 305 and a daughter die 310. Daughter die 310 may be mounted directly on mother die 305 using the flip chip technique. IC 200 may also be a part of a system in a package (SiP).

Figure 2B:
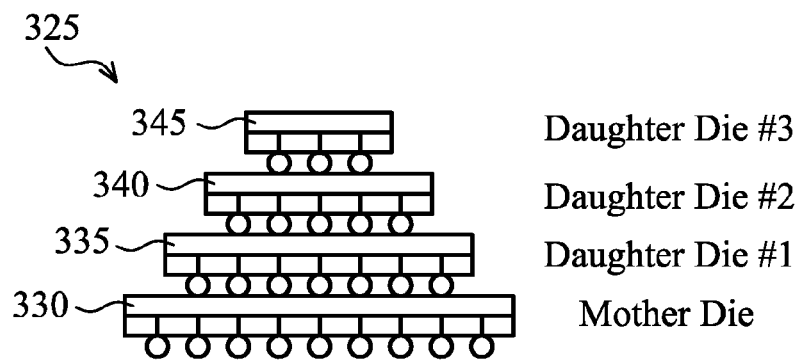
FIG. 2b is a diagram of a second SoC.

FIG. 2b illustrates a SoC 325. SoC 325 comprises a mother die 330, a daughter die #1 335, a daughter die #2 340, and a daughter die #3 345. Daughter die #1 335 may be mounted directly on mother die 330, while daughter die #2 340 may be mounted directly on daughter die #1 335 and daughter die #3 345 may be mounted on daughter die #2 340. Although shown as a vertical stack of four dice, alternate SoC may be formed from other possible combinations of dice. For example, in an alternate SoC, daughter die #1 335 and daughter die #2 340 may be mounted on different portions of mother die 330 and daughter die #3 345 may be mounted on daughter die #2 340. Alternatively, daughter die #1 335, daughter die #2 340, and daughter die #3 345 may be each mounted on different portions of mother die 330. Therefore, the illustration of a single vertical stack should not be construed as being limiting to either the spirit or scope of the embodiments.

Figure 2C:
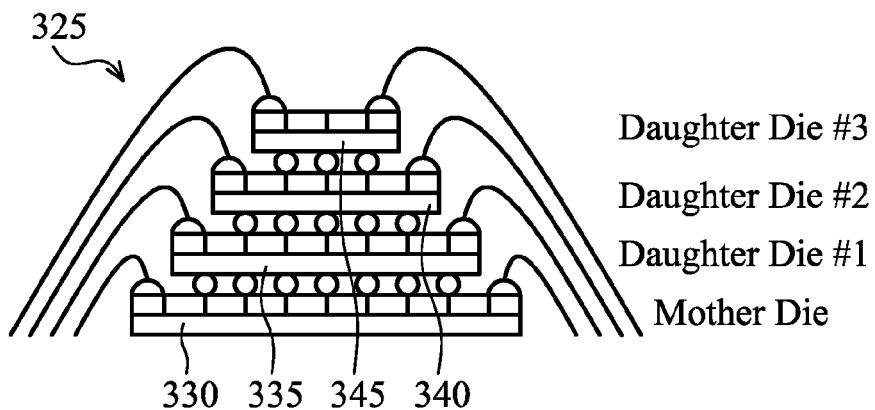
FIG. 2c is a diagram of a third SoC.

However, unlike the flip chip technique wherein power and signals may be routed through the lowest IC of a vertical stack or an interposer, a vertical stack of ICs built using the TSV wire bond architecture, such as IC 200, may have power and signals directly connected to the individual ICs. FIG. 2c illustrates SoC 325 after the application of bond wires. Each of the dice (mother die 330, daughter die #1 335, daughter die #2 340, and daughter die #3 345) may be connected externally using bond wires. The ability to externally connect to each of the dice enables the distribution of power and signals directly to the die without having to route unused power and signals through any of the dice. This may help to minimize the IR drop. Furthermore, since a die does not have to route unused power and signals, it may be possible to minimize the size of the die. As shown in FIG. 2c, the use of TSVs to electrically couple power and signals to BML 220 may allow for ICs (e.g., daughter die #1 335 attaching to mother die 330, daughter die #2 340 to daughter die #1 335, and so forth) to attach to a same side of an IC as BML 220.

As technology advances, design complexity has increased dramatically. Increased design complexity has led to designs having significantly larger device counts and functionality. However, increased device counts have led to higher power dissipation requirements. The greater power dissipation requirements has resulted in not only a larger number of power pads required to supply needed power to internal circuitry, but a dense power mesh is also needed to minimize IR drop. The dense power mesh and associated power pads consume a large amount of available power and signals routing resources of the design. Therefore, chip size of the design as well as production costs have also significantly increased.

Figure 3A:
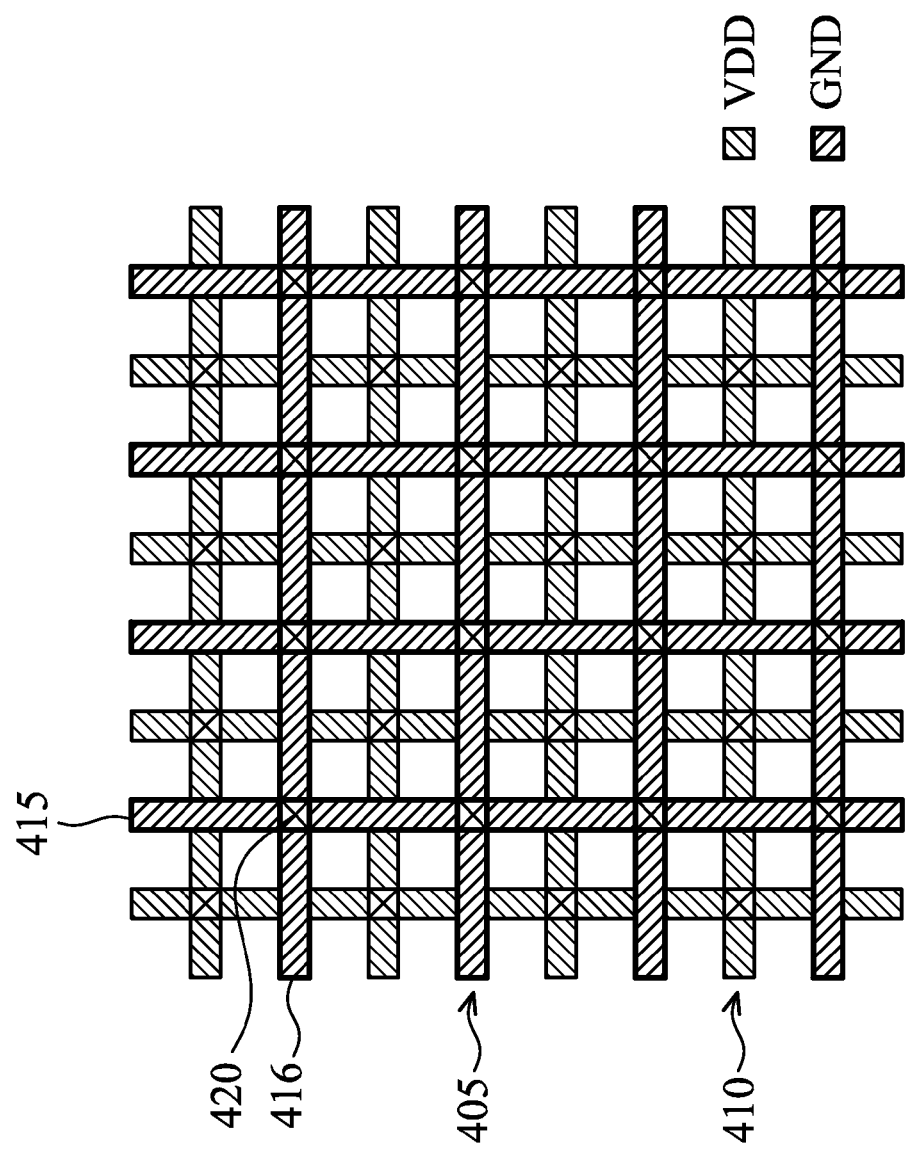
FIG. 3a is a diagram of a prior art power mesh.

FIG. 3a illustrates a prior art power mesh 400. Power mesh 400 comprises a first mesh 405 for distributing electrical ground (GND) and a second mesh 410 for distributing a first potential (VDD). First mesh 405 and second mesh 410 may be formed from different layers, such as different metal layers or a metal layer and a non-metal conductive layer. At the intersection of mesh lines, such as first mesh line 415 and second mesh line 416, a power pad, such as power pad 420, may form electrical connectivity between the two mesh lines. Furthermore, underlying a power pad may be a power route to provide power to internal circuitry. As shown in FIG. 3a, a significant percentage of routing resources (on the order of 30% or more of total routing resources) in an IC is dedicated to routing of power signals.

Figure 3B:
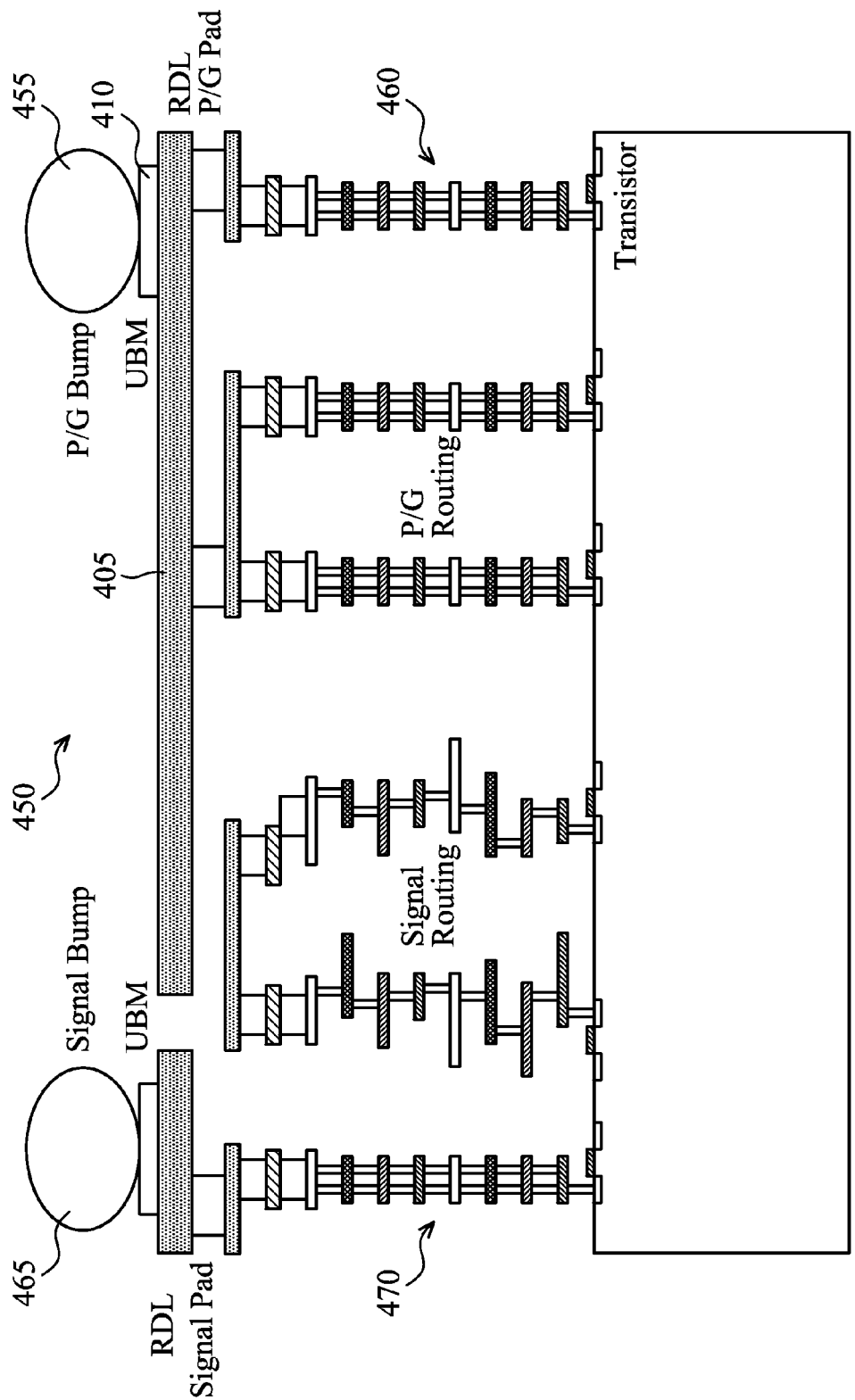
FIG. 3b is a cross-sectional view of an IC, wherein the IC uses a prior art power mesh.

FIG. 3b illustrates a cross-sectional view of an IC 450, wherein IC 450 includes a prior art power mesh for distributing power to IC 450. As shown in FIG. 3b, solder bump 455 may be used to provide electrical connectivity between second mesh 410 and VDD. Power route 460 also shows connecting power to a first transistor in IC 450. Also shown in FIG. 3b, a solder bump 465 provides a signal to a second transistor by way of a signal route 470. The stacked via arrays used in the power and signal routes, such as power route 460 and signal route 470, produce congestion in IC 450, which may make it more difficult to route internal signals in IC 450.

Figure 4A:
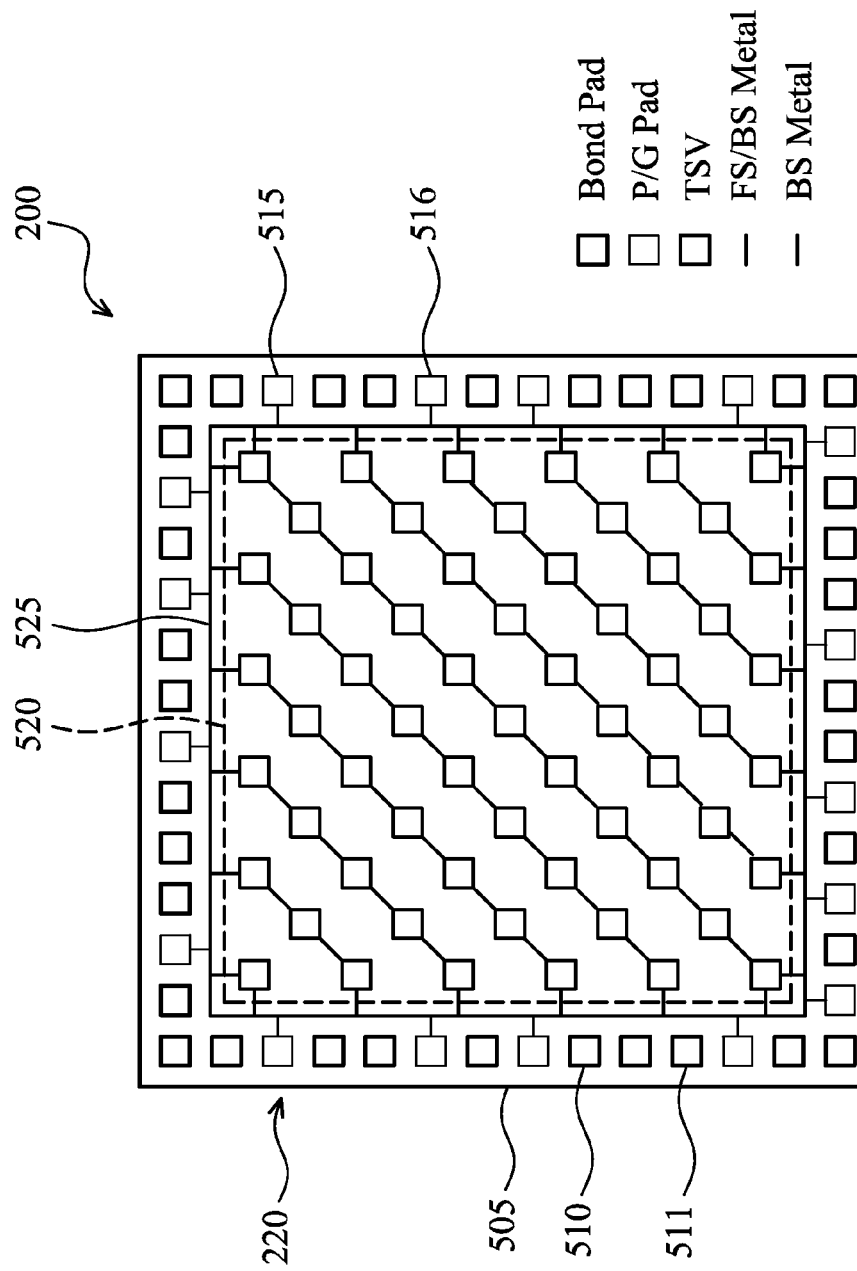
FIG. 4a is a diagram of a bottom view of IC.

FIG. 4a illustrates a bottom view of IC 200, with emphasis on BML 220. As discussed previously, BML 220 may be used for power and signals distribution. BML 220 may have a ring structure, with a power ring 525 formed about a periphery of IC 200, but generally internal to a plurality of pads, including bonding pads (for example, pads 510 and 511) that may be used to provide external signal connectivity to internal circuitry and power pads (for example, pads 515 and 516) that may be used to provide power and ground to internal circuitry. The plurality of pads may be formed in a single ring of pads around power ring 525, as shown in FIG. 4a. Alternatively, depending on the number of pads in the plurality of pads, multiple rings of pads or less than a single ring of pads may be formed around power ring 525.

As shown in FIG. 4a, power ring 525 and the plurality of pads may be formed about a periphery of IC 200. However, depending on power and signals distribution requirements, power ring 525 may not need to be formed about the periphery of IC 200. For example, power ring 525 may be formed about a fraction of a total area of IC 200. Additionally, power ring 525 may be formed on either backside or frontside of IC 200, as well as on both sides of IC 200.

Internal to power ring 525 may be a plurality of TSVs (shown inside highlight 520). The plurality of TSVs may be used to distribute power to internal circuitry of IC 200. The plurality of TSVs may be electrically coupled to power pads outside of power ring 525. For example, some of the TSVs in the plurality of TSVs may be electrically coupled to electrical ground, while other TSVs may be coupled to VDD. The plurality of TSVs may be arranged horizontally, vertically, diagonally, in a zig zag fashion, or randomly, with diagonal arrangement being preferred. Alternatively, the TSVs may be placed as dictated by an arrangement of internal circuitry in IC 200 with no specific arrangement. Power ring 525 may connect some or all of the power pads in the plurality of pads to the plurality of TSVs. Power ring 525 may be formed from backside metal (i.e., power ring 525 are formed on the same side as BML 220), frontside metal (i.e., power ring 525 are formed on a side opposite BML 220), or a combination of both.

An advantage of TSVs is that they are physically smaller than a power and/or signal pad. This may result in an overall area reduction resulting from the pad pitch relaxation. Additionally, the TSVs allow for the use of low cost bond wires for both signal and power connectivity. Furthermore, the TSVs may help to resolve a problem with multiple stacked dies wherein power for dies located high in the die stack must be routed through dies lower in the die stack. This may help to alleviate having to dedicate area in the dies lower in the die stack to route power to the dies located high in the die stack. Similarly, the TSVs may help the IR drop problem by allowing direct connection of power to dies in the die stack. Although shown in FIG. 4a as being connected to power pads, some of the TSVs in the plurality of TSVs may be electrically connected to signal pads.

Figure 4B:
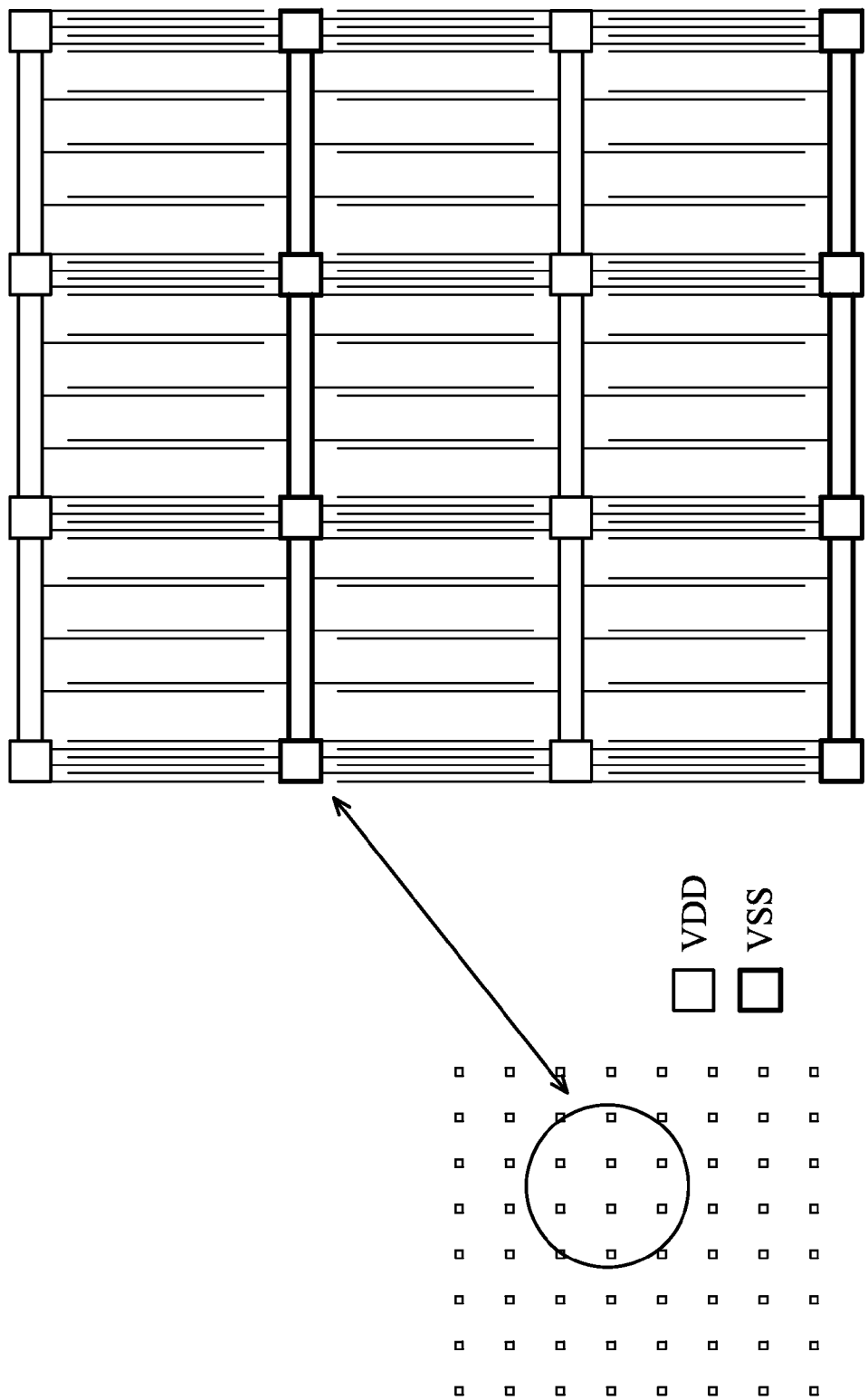
FIG. 4b is a diagram of a grid matrix arrangement for use in distributing power in an IC.
Figure 4C:
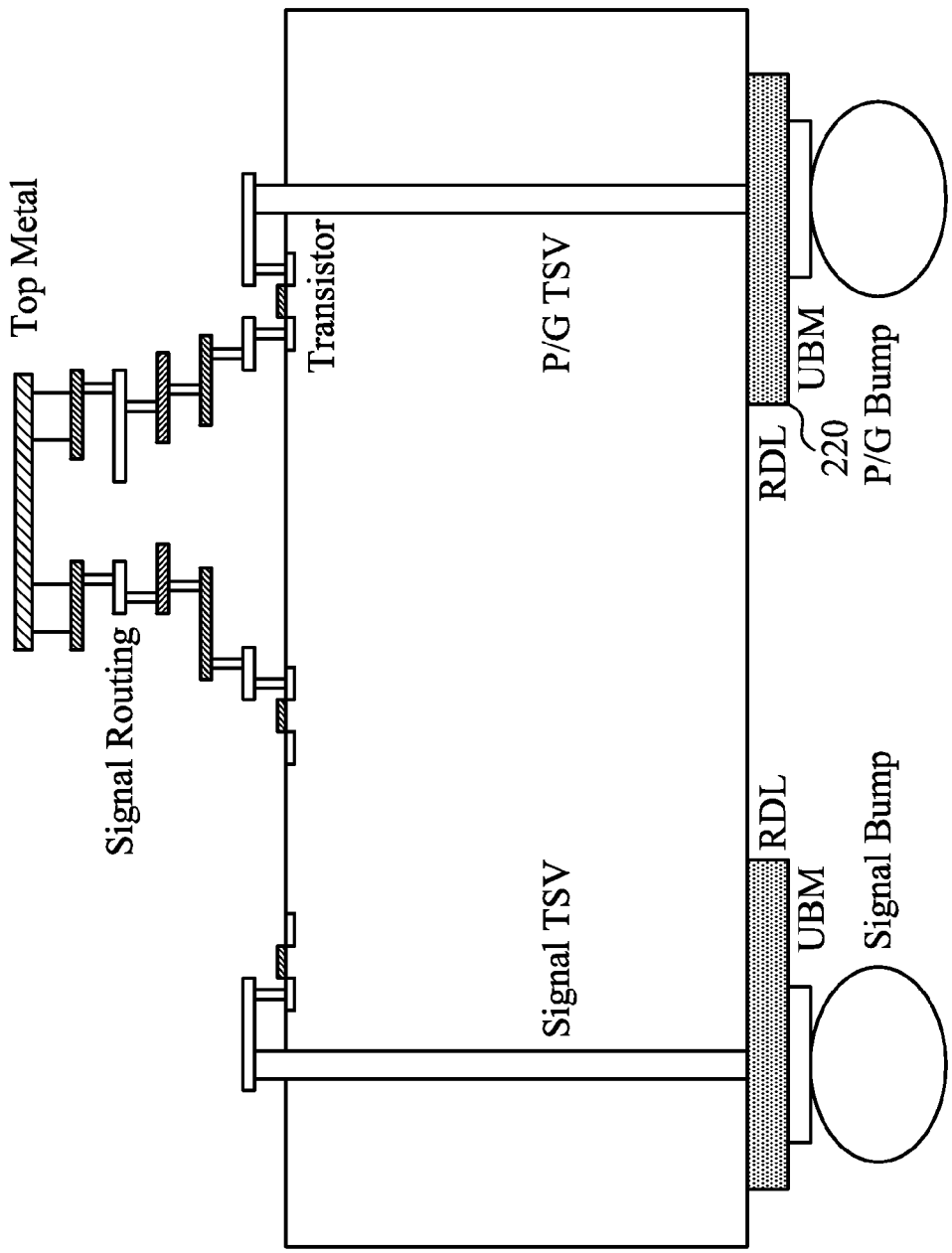
FIG. 4c is a diagram of an IC, wherein the distribution of a signal to internal circuitry of the IC is through a TSV.

FIG. 4b illustrates a grid matrix arrangement for use in distributing power in an IC. The grid matrix approach may be used for power distribution wherein current may directly flow to internal circuitry of the IC through low resistance TSVs, such as those in the plurality of TSVs. The grid matrix arrangement allows the use of a small number of metal layers, such as metal1 and metal2, for local power connections. The grid matrix arrangement may also be connected to BML 220 to further improve overall power distribution. This is shown in FIG. 4c, which illustrates a cross-sectional view of an IC, wherein the IC includes BML 220 and a grid matrix arrangement for distributing power in the IC. As shown in FIG. 4c, since power is distributed in BML 220 and the grid matrix arrangement, most of the internal metal layers of the IC may be used for signal distribution. FIG. 4c also illustrates the distribution of a signal to internal circuitry of the IC through a TSV.

Figure 5A:
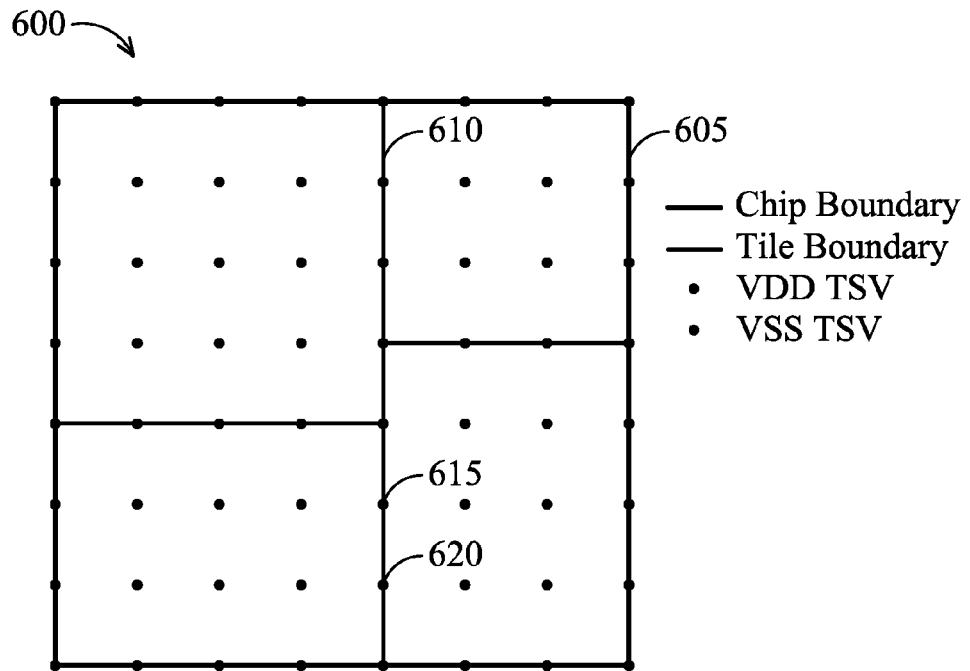
FIG. 5a is a diagram of a partitioning of a grid matrix arrangement for use in distributing power in an IC.

FIG. 5a illustrates a partitioning 600 of a grid matrix arrangement for use in distributing power in an IC. Typically, the IC may be partitioned into a grid system that consists of a minimum grid and a maximum grid (shown as chip boundary 605 and tile boundary 610), wherein the maximum grid is a multiple of the minimum grid. Both the IC and a routing block boundary may then be aligned with the grid matrix arrangement. Then, TSVs may be placed at boundaries where they can be shared by multiple adjacent blocks. For example, TSV 615 may be used to distribute VDD, while TSV 620 may be used to distribute electrical ground.

Figure 5B:
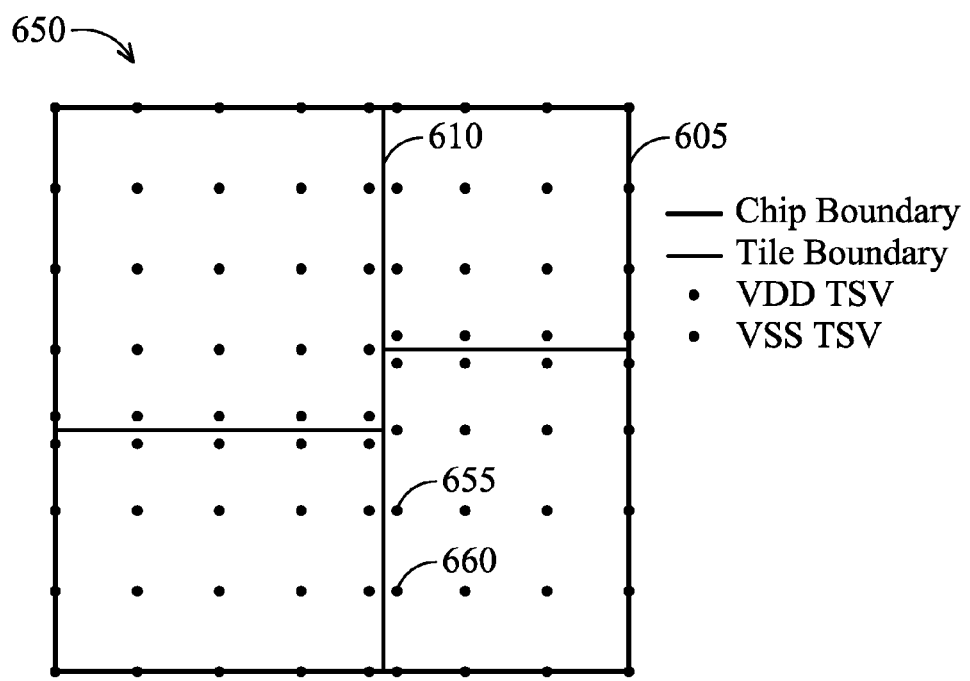
FIG. 5b is a diagram of a partitioning of a grid matrix arrangement for use in distributing power in an IC.

FIG. 5b illustrates a partitioning 650 of a grid matrix arrangement for use in distributing power in an IC. Partitioning 650 is similar to partitioning 600 except that TSVs in partitioning 650 are backed away from tile boundary 610 to create isolated voltage islands. For example, TSV 655 may be used to distribute VDD only for a single voltage island and TSV 660 may be used to distribute VDD only for the single voltage island.

Internal circuitry may be placed following the grid matrix arrangement to maximize current supply without suffering any metal routing blockage issues. The power grid arrangement may be configured vertically, horizontally, diagonally, in a zig zag fashion, or so forth, with the diagonal arrangement being a preferred arrangement.

The TSV wire bond architecture may offer significant advantages over the flip chip architecture. Table 1 provides a summary of significant differences between the TSV wire bond architecture and the flip chip architecture using a power mesh for power distribution based on a N45 process.

TABLE 1

TSV Wire Bond vs. Flip Chip with Power Mesh

| | Flip Chip with Power Mesh | TSV Wire Bond |
|---|---|---|
| Current Flow | Power Mesh Distribution | Via Distribution |
| Pad Size | Passivation Size | TSV Size |
| Intermediate Power Routing | 30% | N/A |
| Via Size with Equivalent Resistance | 10× | 1× |

TABLE 1-continued

TSV Wire Bond vs. Flip Chip with Power Mesh

|  | Flip Chip with Power Mesh | TSV Wire Bond |
|---|---|---|
| Number of Metal Layers | 10 | 6 |
| Decoupling Capacitor | No | Yes |

As summarized in Table 1, significant differences between TSV wire bond and flip chip with power mesh power distribution include: current flow from low resistive TSV directly to device rather than distributed through multiple metal layers (hence less IR drop); no dense intermediate power routing is required, only a few metal layers are needed for local power connections, resulting in dramatic increase in routability; grid matrix arrangement is directly connected to a BML for better current distribution; TSV size with equivalent resistance is 10 times smaller than stacked via array size; both die size and required number of metal layers are reduced; and voltage supply noise is greatly reduced in TSV wire bonding. Additionally, with TSV wire bonding, design cycle time and fabrication yield may be significantly improved.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit (IC) comprising:
a substrate with a top surface and a bottom surface, wherein circuitry is formed on the top surface;
a plurality of bonding pads formed along a periphery of the bottom surface, wherein a first subset of bonding pads in the plurality of bonding pads is electrically coupled to circuitry on the top surface with through silicon vias (TSV); and
a backside metal layer (BML) formed on the bottom surface and electrically coupled to a second subset of bonding pads in the plurality of bonding pads, the BML configured to distribute electrical signals provided by the second subset of bonding pads, wherein the BML is formed within a boundary created by the plurality of bonding pads.

2. The IC of claim 1, wherein each TSV coupled to bonding pads in the first subset of bonding pads comprises:
a first conductive pad formed on the bottom surface;
a second conductive pad formed on the top surface; and
a conductive member electrically coupling the first conductive pad to the second conductive pad, the conductive member formed in a hole formed in the substrate.

3. The IC of claim 2, wherein the first conductive pad, the second conductive pad, and the conductive member are arranged in a linear fashion.

4. The IC of claim 1, wherein the bonding pads in the second subset of bonding pads are either coupled to electrical ground or a first voltage potential.

5. The IC of claim 4, wherein the BML comprises conductors arranged in a grid pattern.

6. The IC of claim 5, wherein conductors in the BML are connected to TSVs coupled to circuitry formed on the top surface to distribute electrical ground or the first voltage potential to circuitry formed on the top surface.

7. The IC of claim 6, wherein conductors in the BML are formed to a thickness that is at least two times greater than a thickness of conductors formed on the top surface.

8. The IC of claim 5, wherein the BML further comprises at least one bump pad coupled to a TSV, the bump pad to permit electrical coupling between the IC and an attached IC or an external substrate.

9. An integrated circuit (IC) comprising:
a substrate with a top surface and a bottom surface, wherein circuitry is disposed on the top surface;
a first bonding pad disposed on the bottom surface, the first bonding pad electrically coupled to circuitry on the top surface with a through silicon via (TSV);
a backside metal layer (BML) disposed on the bottom surface and electrically coupled to a second bonding pad disposed on the bottom surface, the BML configured to distribute a first signal provided by the second bonding pad; and
a power ring disposed about a periphery of the substrate, the power ring to distribute power to circuitry formed on the top surface.

10. The IC of claim 9, wherein the second bonding pad is electrically coupled to the BML through two TSVs.

11. The IC of claim 10, wherein a first TSV conveys the first signal on the second bonding pad to the top surface and a second TSV conveys the first signal to the BML.

12. The IC of claim 11, wherein the first TSV and the second TSV are electrically coupled by a conductor.

13. The IC of claim 9, wherein the BML is further configured to distribute a second signal provided by a third bonding pad.

14. The IC of claim 13, wherein the third bonding pad is directly coupled to the BML.

15. A three-dimensional stacked multi-chip module comprising:
a first integrated circuit (IC) comprising a first substrate with a first top surface and a first bottom surface, wherein circuitry is formed on the first top surface;
a second IC, the second IC comprising,
a second substrate with a second top surface and a second bottom surface, wherein circuitry is formed on the second top surface,
a first plurality of bonding pads formed in a ring structure along a periphery of the second bottom surface, wherein a first subset of bonding pads in the first plurality of bonding pads is electrically coupled to circuitry on the second top surface with through silicon vias (TSV), and
a backside metal layer (BML) formed within the ring structure on the second bottom surface and electrically coupled to a second subset of bonding pads in the plurality of bonding pads, the BML configured to distribute electrical signals provided by the second subset of bonding pads; and
wherein the first IC is attached to the second IC.

16. The three-dimensional stacked multi-chip module of claim 15, wherein the first top surface of the first IC is attached to the second bottom surface of the second IC.

17. The three-dimensional stacked multi-chip module of claim 15, wherein bond wires are used to electrically couple each of the bonding pads in the plurality of bonding pads to external signals.

18. The three-dimensional stacked multi-chip module of claim 15, wherein the first IC further comprises:

a second plurality of bonding pads formed along a periphery of the first bottom surface, wherein a third subset of bonding pads in the second plurality of bonding pads are electrically coupled to circuitry on the first top surface with TSVs; and a backside metal layer (BML) formed on the first bottom surface and electrically coupled to a fourth subset of bonding pads in the plurality of bonding pads, the BML configured to distribute electrical signals provided by the fourth subset of bonding pads.

19. The three-dimensional stacked multi-chip module of claim 18, wherein bond wires are used to electrically couple each of the bonding pads in the second plurality of bonding pads with external signals.

* * * * *